United States Patent
Yang et al.

(10) Patent No.: US 9,735,132 B1
(45) Date of Patent: Aug. 15, 2017

(54) SEMICONDUCTOR PACKAGE

(71) Applicant: ChipMOS Technologies Inc., Hsinchu (TW)

(72) Inventors: Cheng-Yu Yang, Hsinchu (TW); Cheng-Yi Weng, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 15/358,152

(22) Filed: Nov. 22, 2016

(30) Foreign Application Priority Data

Aug. 10, 2016 (TW) .............................. 105125387 A

(51) Int. Cl.
*H01L 23/48* (2006.01)
*H01L 25/065* (2006.01)
*H01L 23/00* (2006.01)

(52) U.S. Cl.
CPC .......... *H01L 25/0657* (2013.01); *H01L 24/06* (2013.01); *H01L 24/10* (2013.01); *H01L 24/13* (2013.01); *H01L 24/17* (2013.01); *H01L 24/26* (2013.01); *H01L 24/32* (2013.01); *H01L 2224/0603* (2013.01); *H01L 2224/06155* (2013.01); *H01L 2224/06156* (2013.01); *H01L 2224/06177* (2013.01); *H01L 2224/10126* (2013.01); *H01L 2224/10145* (2013.01); *H01L 2224/13147* (2013.01); *H01L 2224/13611* (2013.01); *H01L 2224/1703* (2013.01); *H01L 2224/17051* (2013.01); *H01L 2224/17155* (2013.01); *H01L 2224/17156* (2013.01); *H01L 2224/17177* (2013.01); *H01L 2224/26155* (2013.01); *H01L 2224/26175* (2013.01); *H01L 2224/3201* (2013.01); *H01L 2224/32058* (2013.01); *H01L 2224/32059* (2013.01); *H01L 2225/06513* (2013.01);

(Continued)

(58) Field of Classification Search
CPC .................................................. H01L 23/3128
See application file for complete search history.

(56) References Cited

U.S. PATENT DOCUMENTS

| 8,319,961 B2* | 11/2012 | Ryu ................. G01N 21/95684 356/237.1 |
| 8,409,923 B2 | 4/2013 | Kim et al. |
| 2007/0289777 A1* | 12/2007 | Pendse ................ H01L 23/3128 174/520 |

FOREIGN PATENT DOCUMENTS

TW M455256 6/2013

OTHER PUBLICATIONS

"Office Action of Taiwan Counterpart Application", issued on Apr. 12, 2017, p. 1-p. 4.

\* cited by examiner

*Primary Examiner* — Samuel Gebremariam
(74) *Attorney, Agent, or Firm* — Jianq Chyun IP Office

(57) ABSTRACT

A semiconductor package includes a first chip, an insulating protection layer, a second chip, a plurality of second conductive bumps and an underfill. The insulating protection layer is disposed on a first active surface of the first chip and includes a concave. Projections of a plurality of first inner pads and a plurality of first outer pads of the first chip projected on the insulating protection layer are located in the concave and out of the concave, respectively. The second chip is flipped on the concave and includes a plurality of second pads. Each of the first inner pads is electrically connected to the corresponding second pad through the corresponding second conductive bump. The underfill is disposed between the concave and the second chip and covers the second conductive bumps.

10 Claims, 2 Drawing Sheets

(52) U.S. Cl.
CPC ............... *H01L 2225/06517* (2013.01); *H01L 2225/06527* (2013.01); *H01L 2225/06568* (2013.01)

SEMICONDUCTOR PACKAGE

CROSS-REFERENCE TO RELATED APPLICATION

This application claims the priority benefit of Taiwan application serial no. 105125387, filed on Aug. 10, 2016. The entirety of the above-mentioned patent application is hereby incorporated by reference herein and made a part of this specification.

BACKGROUND OF THE INVENTION

1. Field of the Invention

The present invention relates to a package. More particularly, the present invention relates to a semiconductor package.

2. Description of Related Art

With rapid advance in technologies, integrated circuits (ICs) have been extensively used in our daily lives. Typically, IC manufacturing can be roughly classified into three main stages: a silicon wafer fabrication stage, an IC fabrication stage, and an IC package stage.

In current package structure, flipping a small chip on a large chip is a common package method. The large chip has solder pads on which solder balls are disposed for electrically connecting the package structure to the circuit board. Generally, the connecting area between the large chip and the small chip is filled with an underfill for protecting the conductive bumps between such chips. However, if the positions of the solder pads are too close to the position for filling the underfill, the underfill may overflow on the solder pads during the process of filling the underfill, which affects the electrically connecting status of the solders. Even the solders are disposed on the solder pads in advance, the underfill may overflow on the solders, which affects the electrically connecting status of the solders and other circuit boards.

SUMMARY OF THE INVENTION

The present invention provides a semiconductor package, which can reduce the chance that the underfill overflows on the solder pads or solders.

A semiconductor package of the present invention comprises a first chip, an insulating protection layer, a second chip, a plurality of second conductive bumps and an underfill. The first chip comprises a first active surface and the first active surface has a chip connecting area, a plurality of first inner pads located in the chip connecting area and a plurality of first outer pads located out of the chip connecting area. The insulating protection layer is disposed on the first active surface of the first chip. The plurality of first inner pads and the plurality of first outer pads are exposed from the insulating protection layer. The insulating protection layer comprises a concave and projections of the plurality of first inner pads and the plurality of first outer pads of the first chip projected on the insulating protection layer are located in the concave and outside the concave, respectively. The plurality of first conductive bumps is disposed on the plurality of first outer pads. A second chip is flipped on the concave of the insulating protection layer which corresponding to the chip connecting area, wherein the second chip comprises a plurality of second pads. The plurality of second conductive bumps is located in the concave and between the plurality of first inner pads and the plurality of second pads. Each of the first inner pads is electrically connected to the corresponding second pad through the corresponding second conductive bump. The underfill is disposed between the concave and the second chip and covers the second conductive bumps.

In one embodiment of the present invention, an area of the concave on the first active surface at least comprises an area of the second chip projected on the first active surface.

In one embodiment of the present invention, a depth of the concave is less than a thickness of the insulating protection layer.

In one embodiment of the present invention, a depth of the concave is equal to a thickness of the insulating protection layer.

In one embodiment of the present invention, the second chip comprises a second active surface and a back surface opposite to the second active surface. The depth of the concave is less than distance between the back surface of the second chip and a bottom surface of the concave.

In one embodiment of the present invention, a size of the first chip is greater than a size of the second chip.

In one embodiment of the present invention, a height of each of the first conductive bumps is greater than a height of each of the second conductive bump.

In one embodiment of the present invention, the semiconductor package further comprises a circuit board. The circuit board is electrically connected to the plurality of first conductive bumps, wherein the second chip, the plurality of first conductive bumps and the plurality of second conductive bumps are located between the circuit board and the first chip.

In one embodiment of the present invention, the plurality of first conductive bumps and the plurality of second conductive bumps are copper pillars.

In one embodiment of the present invention, the plurality of first conductive bumps or the plurality of second conductive bumps includes a layer of tin disposed on copper pillars.

Based on the above, the insulating protection layer of the semiconductor package of the present invention is disposed on the first active surface of the first chip. The insulating protection layer has the concave with a size between an area surrounded by the first inner pads of the first chip and an area surrounded by the first outer pads. The second chip is flipped on the concave of the insulating protection layer and electrically connects to the first chip though the second conductive bumps. The underfill for protecting the second conductive bumps is filled between the concave and the second chip, thus the flow range of the underfill is limited by the concave. In other words, the semiconductor package of the present invention limits the flow range of the underfill through the concave of the insulating protection layer and reduces the possibility that the underfill overflows.

To make the above features and advantages of the present invention more comprehensible, several embodiments accompanied with drawings are described in detail as follows.

DESCRIPTION OF THE EMBODIMENTS

Figure 1:
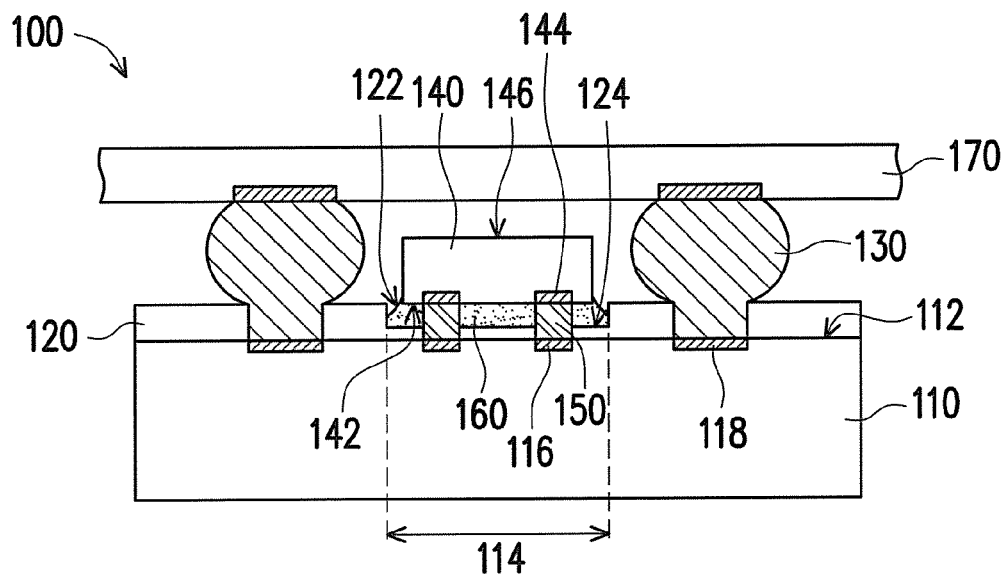
FIG. 1 is a lateral view schematic diagram of the semiconductor package in accordance with an embodiment of the present invention.

FIG. 1 is a lateral view schematic diagram of the semiconductor package 100 in accordance with an embodiment of the present invention. As shown in FIG. 1, a semiconductor package 100 of the present embodiment comprises a first chip 110, an insulating protection layer 120, a plurality of first conductive bumps 130, a second chip 140, a plurality of second conductive bumps 150, an underfill 160 and a board circuit 170. In the present embodiment, the semiconductor package 100 is a chip on chip (COC) package structure as an example. In other embodiment, the semiconductor package 100 can also be a chip on wafer (COW) package structure.

The first chip 110 comprises a first active surface 112, and the first active surface 112 has a chip connecting area 114, a plurality of first inner pads 116 located in the chip connecting area 114 and a plurality of first outer pads 118 located outside the chip connecting area 114.

The insulating protection layer 120 is disposed on the first active surface 112 of the first chip 110. The plurality of first inner pads 116 and the plurality of first outer pads 118 are exposed from the insulating protection layer 120. The insulating protection layer 120 comprises a concave 122 located corresponding to the chip connecting area 114. Thus, projections of the plurality of first inner pads 116 and a plurality of first outer pads 118 projected on the insulating protection layer 120 are located in the concave 122 and outside the concave 122, respectively. In the present embodiment, the depth of the concave 122 is less than the thickness of the insulating protection layer 120 as an example. In other embodiment, the depth of the concave 122 can also be equal to the thickness of the insulating protection layer 120. In other words, in other embodiment, a portion of the first active area 112 of the first chip 110 corresponding to the chip connecting area 114 can be exposed from the insulating protection layer 120.

In the present embodiment, a material of the insulating protection layer 120 comprises polyimide (PI), for example, but the present invention is not limited thereto. And, the process that forming a concave 122 on the insulating protection layer 120 is, for example, lithography process, laser process or reactive ion etching (RIE).

In the present embodiment, a size of the first chip 110 is greater than that of the second chip 140. The small-size second chip 140 is flipped on the concave 122 of the insulating protection layer 120 which corresponding to the chip connecting area 114 of the large-size first chip 110. The second chip 140 comprises a second active surface 142, a back surface 146 opposite to the second active surface 142 and a plurality of second pads 144 located on the second active surface 142. The plurality of second conductive bumps 150 are located in the concave 122 and between the plurality of first inner pads 116 and the plurality of second pads 144. That is, each of the first inner pads 116 is electrically connected to the corresponding second pad 144 through the corresponding second conductive bump 150.

Moreover, the plurality of first conductive bumps 130 are disposed on the plurality of first outer pads 118. The first connective bumps 130 are, for example but not limited to, solders. A circuit board 170 is electrically connected to the first chip 110 though the plurality of first connective bumps 130.

In the present embodiment, the plurality of first conductive bumps 130 and the plurality of second conductive bumps 150 are located between the circuit board 170 and the first chip 110. The height of each of the first conductive bump 130 is greater than that of each of the second conductive bump 150. Furthermore, the height of the first conductive bump 130 is greater than the total height of the second conductive bump 150 and the second chip 140.

Moreover, in the present embodiment, the material of first connective bumps 130 and the second connective bumps 150 comprises single metal element or alloy. Such material can be lead-containing material (for example, lead or tin-lead alloy) or lead-free material (for example, gold, silver, copper, tin, nickel, or alloy thereof). Base on the Figs of the present invention, the first connective bumps 130 and the second connective bumps 150 are, for example but not limited to, spherical and cylindrical, respectively. The material of the first connective bumps 130 and the second connective bumps 150 can be selected from one metal material or from two or more metal material, and the first connective bumps 130 and the second connective bumps 150 can be formed by electroplating. For example, forming solder layers or solder caps on copper pillars or covering gold layers on the copper pillars are workable connective bumps in the present invention.

The underfill 160 is disposed between the concave 122 of the insulating protection layer 120 and the second chip 140 and covers the second conductive bumps 150. In the present embodiment, the material of the underfill 160 is, for example but not limited to, epoxy resin. The underfill 160 provides the function for fixing the first chip 110 and the second chip 140, buffer, moisture-proof and dust-proof, which increases the reliability of the semiconductor package 100.

Generally, while manufacturing the semiconductor package 100, the second chip 140 is flipped on and electrically connected to the first chip 110, and the underfill 160 is filled between the first chip 110 and the second chip 140. Then the first chip 110 is connected to the circuit board 170 though the first conductive bump 130 for electrically connecting the first chip 110, the second chip 140 and the circuit board 170. However, owe to the position of the first conductive bumps 130 is nearby the chip connecting area 114, when filling the underfill 160 between the first chip 110 and the second chip 140, the underfill 160 may overflow and contact with the first conductive bumps 130.

In order to avoid the influence of the connectivity between the first conductive bumps 130 and the circuit board 170 after the first conductive bumps 130 are attached by the underfill 160, in the present embodiment, the concave 122 is made on the insulating protection layer 120 of the semiconductor package 100 for limiting the flow range of the underfill 160, which avoids the underfill 160 overflowing and attaching to the first conductive bumps 130.

Figure 2:
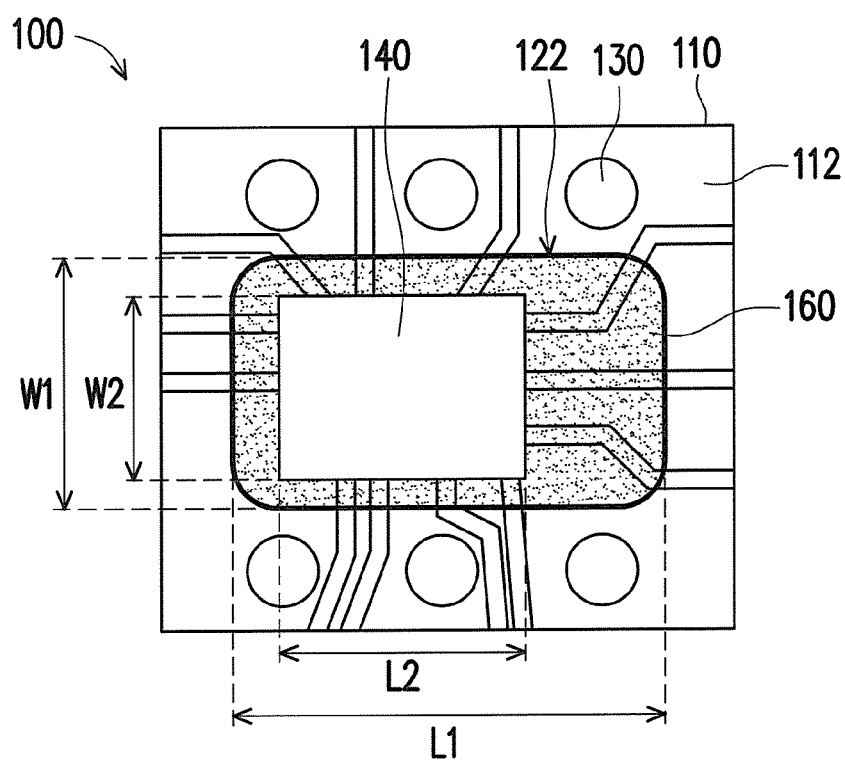
FIG. 2 is a top view schematic diagram of the semiconductor package in FIG. 1 without the circuit board.

FIG. 2 is a top view schematic diagram of the semiconductor package 100 in FIG. 1 without the circuit board 170. Please refer to FIG. 2, in the present embodiment, the area of the concave 122 on the first active surface 112 at least comprises the area of the second chip 140 projected on the first active surface 112. That is, the size of the concave 122 is greater than that of the second chip 140. In the present embodiment, the length L1 of concave 122 is greater than the length L2 of the second chip 140, and the width W1 of the concave 122 is greater than the width W2 of the second chip 140.

Figure 3:
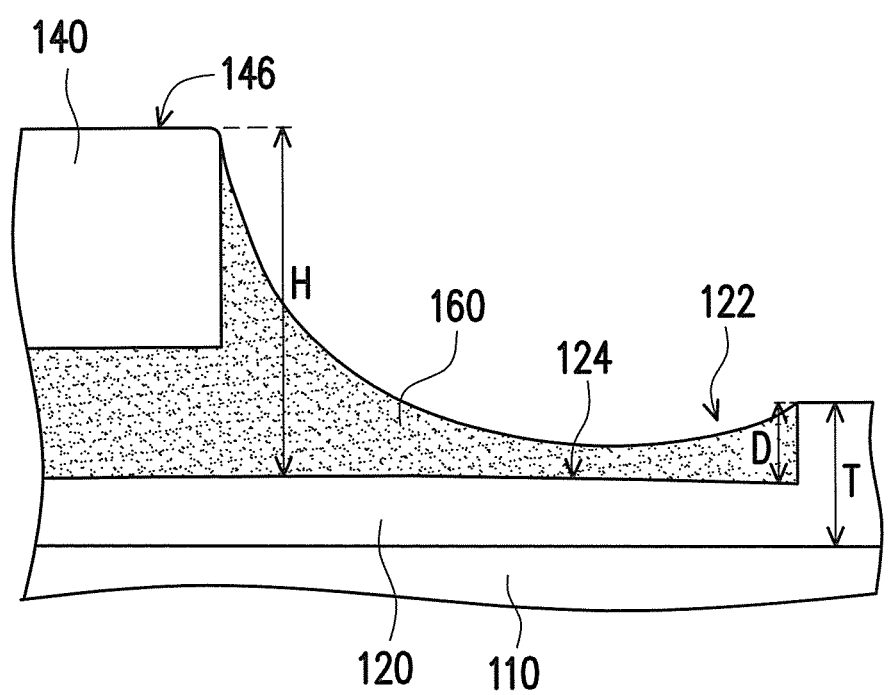
FIG. 3 is a partially enlarged schematic diagram of the semiconductor package in FIG. 1 without the circuit board.

FIG. 3 is a partially enlarged schematic diagram of the semiconductor package 100 in FIG. 1 without the circuit board 170. Please refer to FIG. 3, the depth D of the concave 122 is less than the thickness T of the insulating protection layer 120 and is also less than the distance H between the back surface 146 of the second chip 140 and a bottom surface 124 of the concave 122. The distance H between the back surface 146 of the second chip 140 and a bottom surface 124 of the concave 122 is greater than the depth D of the concave 122, thus when filling the underfill 160 in the concave 122, the underfill 160 is less likely to flow to the back surface 146 of the second chip 140 and to attach to the back surface 146 of the second chip 140.

In summary, the insulating protection layer of the semiconductor package of the present invention is disposed on the first active surface of the first chip. The insulating protection layer has the concave with a size between an area surrounded by the first inner pads of the first chip and an area surrounded by the first outer pads. The second chip is flipped on the concave of the insulating protection layer and electrically connects to the first chip though the second conductive bumps. The underfill for protecting the second conductive bumps is filled between the concave and the second chip, thus the flow range of the underfill is limited by the concave. In other words, the semiconductor package of the present invention limits the flow range of the underfill through the concave of the insulating protection layer and reduce the possibility that the underfill overflows.

It will be apparent to those skilled in the art that various modifications and variations can be made to the structure of the present invention without departing from the scope or spirit of the invention.

What is claimed is:

1. A semiconductor package, comprising:
    a first chip, comprising a first active surface, wherein the first active surface has a chip connecting area, a plurality of first inner pads located in the chip connecting area and a plurality of first outer pads located out of the chip connecting area;
    an insulating protection layer, disposed on the first active surface of the first chip, wherein the plurality of first inner pads and the plurality of first outer pads are exposed from the insulating protection layer, the insulating protection layer comprises a concave, wherein a projection of the plurality of first inner pads projected on the insulating protection layer is located in the concave, and a projection of the plurality of first outer pads projected on the insulating protection layer is located outside the concave;
    a plurality of first conductive bumps, disposed on the plurality of first outer pads;
    a second chip, flipped on the concave of the insulating protection layer and corresponding to the chip connecting area, wherein the second chip comprises a plurality of second pads;
    a plurality of second conductive bumps, located in the concave and between the plurality of first inner pads and the plurality of second pads, wherein each of the first inner pads is electrically connected to the corresponding second pad through the corresponding second conductive bump; and
    an underfill, disposed between the concave of the insulating protection layer and the second chip, wherein the underfill covers the second conductive bumps.

2. The semiconductor package of claim 1, wherein an area of the concave on the first active surface at least comprises an area of the second chip projected on the first active surface.

3. The semiconductor package of claim 1, wherein a depth of the concave is less than a thickness of the insulating protection layer.

4. The semiconductor package of claim 1, wherein a depth of the concave is equal to a thickness of the insulating protection layer.

5. The semiconductor package of claim 1, wherein the second chip comprises a second active surface and a back surface opposite to the second active surface, wherein a depth of the concave is less than a distance between the back surface of the second chip and a bottom surface of the concave.

6. The semiconductor package of claim 1, wherein a size of the first chip is greater than a size of the second chip.

7. The semiconductor package of claim 1, wherein a height of each of the first conductive bumps is greater than a height of each of the second conductive bumps.

8. The semiconductor package of claim 1, further comprising
    a circuit board, wherein the circuit board is electrically connected to the plurality of first conductive bumps, wherein the second chip, the plurality of first conductive bumps and the plurality of second conductive bumps are located between the circuit board and the first chip.

9. The semiconductor package of claim 1, wherein the plurality of first conductive bumps and the plurality of second conductive bumps are copper pillars.

10. The semiconductor package of claim 9, wherein the plurality of first conductive bumps or the plurality of second conductive bumps comprises a layer of tin disposed on the copper pillars.

* * * * *